United States Patent
Sankar et al.

(10) Patent No.: US 9,541,299 B2
(45) Date of Patent: Jan. 10, 2017

(54) SETTING-INDEPENDENT CLIMATE REGULATOR CONTROL

(71) Applicant: Microsoft Corporation, Redmond, WA (US)

(72) Inventors: Sriram Sankar, Redmond, WA (US); Brandon Rubenstein, Lynnwood, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 514 days.

(21) Appl. No.: 13/714,714

(22) Filed: Dec. 14, 2012

(65) Prior Publication Data

US 2014/0172185 A1    Jun. 19, 2014

(51) Int. Cl.
F24F 11/00         (2006.01)
H05K 7/20          (2006.01)

(52) U.S. Cl.
CPC ....... *F24F 11/0079* (2013.01); *H05K 7/20836* (2013.01); *F24F 2011/0063* (2013.01); *Y02B 30/746* (2013.01)

(58) Field of Classification Search
USPC   700/300, 298, 299, 276, 245, 282; 454/184, 239, 256
See application file for complete search history.

(56) References Cited

U.S. PATENT DOCUMENTS

| | | | |
|---|---|---|---|
| 4,874,127 A * | 10/1989 | Collier | F24F 3/044 165/205 |
| 5,332,886 A * | 7/1994 | Schilling et al. | 219/506 |
| 6,023,402 A | 2/2000 | Kaminski | |
| 6,270,319 B1 * | 8/2001 | Lyszkowski et al. | 417/2 |
| 6,643,128 B2 * | 11/2003 | Chu | G06F 1/206 318/471 |

(Continued)

OTHER PUBLICATIONS

Kant, Krishna, "Data Center Evolution: A Tutorial on State of the Art, Issues, and Challenges"—Published Date: Dec. 3, 2009, Proceedings: Elsevier Computer Networks Journal, pp. 27 http://www.cse.iitb.ac.in/~puru/courses/spring11/cs620/references/dcevolve.pdf.

(Continued)

*Primary Examiner* — Kidest Bahta
(74) *Attorney, Agent, or Firm* — Henry Gabryjelski; Kate Drakos; Micky Minhas

(57) ABSTRACT

Climate regulation within an enclosure (e.g., a server cabinet) may involve a climate regulator device that reports a set of available settings (e.g., fan speeds of a fan array) to a computational unit that selects among the available settings. However, such techniques involve bidirectional communication between the climate regulator device and a computational unit that is capable of utilizing the device-specific settings. Presented herein are climate regulation architectures involving a request from the computational unit as a climate target that is independent of the settings of the climate regulator devices (e.g., an selection on an arbitrary scale from 0 to 100). A climate regulator controller may map the device-independent climate target to a selection among the available settings of the particular climate regulator device(s). Further variations may involve conflict resolution among requests from different computational sub-units, and/or failsafe mechanisms such as default climate regulator device settings to alleviate controller failure.

20 Claims, 7 Drawing Sheets

(56) References Cited

U.S. PATENT DOCUMENTS

| | | | |
|---|---|---|---|
| 6,826,456 B1* | 11/2004 | Irving | G06F 1/20 361/695 |
| 6,996,441 B1 | 2/2006 | Tobias | |
| 7,948,196 B2 | 5/2011 | Begun | |
| 8,165,727 B2* | 4/2012 | Tsutsui | G06F 1/203 257/713 |
| 8,845,188 B2 | 9/2014 | Bash | |
| 8,899,060 B2 | 12/2014 | Hall | |
| 2003/0011984 A1* | 1/2003 | Chu | G06F 1/206 361/679.48 |
| 2004/0100765 A1 | 5/2004 | Crippen | |
| 2004/0132398 A1 | 7/2004 | Sharp | |
| 2004/0217072 A1 | 11/2004 | Bash et al. | |
| 2004/0218355 A1 | 11/2004 | Bash et al. | |
| 2005/0030171 A1* | 2/2005 | Liu | G06F 1/206 340/500 |
| 2005/0182523 A1 | 8/2005 | Nair | |
| 2008/0232974 A1* | 9/2008 | Tsuchiya | G06F 1/20 417/14 |
| 2008/0306635 A1* | 12/2008 | Rozzi | G06F 1/206 700/300 |
| 2009/0205416 A1 | 8/2009 | Campbell | |
| 2010/0110633 A1 | 5/2010 | Gigushinsky | |
| 2010/0286843 A1 | 11/2010 | Lyon | |
| 2011/0054705 A1 | 3/2011 | Vaidyanathan | |
| 2011/0093856 A1 | 4/2011 | Campbell | |
| 2011/0125452 A1 | 5/2011 | Bash | |
| 2011/0128699 A1 | 6/2011 | Heydari | |
| 2011/0160916 A1 | 6/2011 | Bahali | |
| 2011/0176275 A1 | 7/2011 | Sato | |
| 2011/0224837 A1* | 9/2011 | Moss | G06F 1/206 700/295 |
| 2011/0228471 A1 | 9/2011 | Humphrey | |
| 2011/0292601 A1 | 12/2011 | Campbell | |
| 2011/0307103 A1* | 12/2011 | Cheung | F24F 11/006 700/278 |
| 2012/0010754 A1 | 1/2012 | Matteson | |
| 2012/0116590 A1 | 5/2012 | Florez-Larrahondo | |
| 2012/0226922 A1 | 9/2012 | Wang | |
| 2013/0055744 A1 | 3/2013 | Travers | |
| 2013/0098599 A1* | 4/2013 | Busch et al. | 165/294 |
| 2013/0128455 A1* | 5/2013 | Koblenz | G05D 23/1917 361/692 |
| 2013/0158713 A1* | 6/2013 | Geissler | G05D 23/1932 700/275 |
| 2014/0052429 A1* | 2/2014 | Kelkar et al. | 703/13 |
| 2014/0117908 A1* | 5/2014 | Busch et al. | 318/471 |

OTHER PUBLICATIONS

Kodama, et al., "Power Reduction Scheme of Fans in a Blade System by Considering the Imbalance of CPU Temperatures"—Published Date: Dec. 18-20, 2010, Proceedings: 2010 IEEE/ACM International Conference on Green computing and Communications, pp. 81-87, http://ieeexplore.ieee.org/stamp/stamp.jsp?tp=&amumber=5724815.

Robert C., "Thermal Design Insights into the Dell M91 0 Blade Server"—Published Date: Aug. 11, 2010, pp. 1-2, http://en.community.dell.com/dell-blogs/enterprise/b/inside-enterprise-iUarchive/2010/08/11/thermal-design-insights-into-the-dell-m910-blade-server.aspx.

Bean, John, "In-Row® RC Cooling of HP C-Ciass Chassis"—Published Date: 2007, pp. 1-5, http://www.apcmedia.com/salestools/KSIH-6Z5SGU_RO_EN.pdf.

Pre-interview First Office Action issued in U.S. Appl. No. 13/530,899 on Oct. 23, 2015, 5 pages.

Pre-interview First Office Action issued in U.S. Appl. No. 13/530,899 on May 11, 2016, 6 pages.

Pre-interview First Office Action issued in U.S. Appl. No. 13/530,899 on Nov. 4, 2016, 4 pages.

* cited by examiner

SETTING-INDEPENDENT CLIMATE REGULATOR CONTROL

BACKGROUND

Within the field of computing, many scenarios involve an enclosure of a computational unit, such as a cabinet for a computer comprising a set of electronic components (e.g., processors, memory components, and nonvolatile storage devices), where climate regulation within the enclosure is achieved through the use of one or more climate regulators. Because excess heat may disrupt the accurate operation of the computational unit and eventually cause thermal damage, the enclosure may comprise thermal climate regulators, such as a set of fans positioned and configured to draw air into the enclosure, push the air over the components of the computational unit, and expel heated air out of the enclosure as exhaust. More powerful temperature regulation may be achieved through the use of heating components and/or air conditioning components that actively heat or cool the inlet air or the residual air within the enclosure. Other types of climate regulators may manage other climate properties of the enclosure (e.g., humidity regulators may add or remove moisture from the inlet air; air pressure regulators may adjust the air pressure within the enclosure; and air filter regulators may remove particulate contaminants of inlet air). These "active" climate regulators may interoperate with "passive" climate regulators (e.g., heatsinks that physically contact the electronic components and diffuse heat over a large area surface) to regulate the climate within the enclosure.

Many types of climate regulators provided within an enclosure may present configurable operating settings. For example, fans may be set to operate at faster or slower fan speeds to achieve variable cooling, and a fan array may adjust the number of operating fans. While more powerful climate regulation may be desirable to maintain the climate within the enclosure within a precise range, higher operating rates of climate regulators may involve greater energy expenditure (e.g., higher electricity costs and faster drain of batteries of portable devices) and/or increased noise or vibration within the enclosure. Accordingly, the operating settings of climate regulators may be adjusted by a user and/or automatically by the enclosure.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In many enclosures, a computational unit utilizes a climate regulator device by choosing among the available climate regulator settings. For example, a fan array may specify a set of fan settings to the computational unit, and the computational unit may select a desired setting and operate the fan at the selected setting. In more sophisticated scenarios, the fan array may specify the capabilities associated with each setting (e.g., the rate of cooling or target temperature achievable by a particular setting) in order to enable the computational unit to provide a more accurate selection.

However, scenarios wherein the computational unit performs a device-specific selection may present various disadvantages. As a first example, a climate regulator device may specify its settings in a manner that the computational unit is unable to utilize (e.g., the computational unit may operate on degrees Celsius, and a fan array may specify climate regulation in degrees Fahrenheit). Moreover, a new climate regulating technology may provide a different type of setting that the computational unit does not understand or support (e.g., a water-cooled thermal flushing system may report its cooling settings as a flow rate achievable by the pump). As a second example, such architectures involve a bidirectional communication architecture between the climate regulator device and the computational unit (e.g., the climate regulator device reporting its settings to the computational unit, and the computational unit informing the climate regulator device of its selection), wherein the complexity of the climate regulation infrastructure may be reduced without diminished functionality. As a third example, such architecture may provide limited management support, such as reconciling conflicting requests from two or more computational sub-units; applying a request to two or more climate regulator devices; or recovering from failures in the climate regulation infrastructure.

Presented herein are climate regulating infrastructures and components that provide comparatively efficient and flexible regulation. In accordance with these techniques, the computational unit may specify a climate target that is independent of the climate regulator settings of the climate regulator device, such as an arbitrary climate regulation gradient specified on a scale of 0 to 100, wherein 0 indicates minimum climate regulation (e.g., no climate regulation) and 100 indicates maximum climate regulation. A climate regulator controller may receive the climate target from the computational unit, and may map the climate target into a selection of a setting among the settings supported by the particular climate regulator device(s) provided in the enclosure. Such architectures dissociate the requests issued by the computational unit from the particular settings and capabilities of the climate regulator device, thus avoiding the communication of the capabilities to the computational unit and the specification of the climate target as a setting of the climate regulator device. Such architectures may also enable the translation of device-independent requests to device-specific requests for devices without particular support by the computational units, including new or unusual climate regulator components. Moreover, the specification of climate regulation in a device-independent manner may facilitate the resolution of conflicts, such as choosing a climate regulator device setting based on multiple conflicting requests received from different computational sub-units, and choosing among several combinations of settings for a set of climate regulator devices that may each be compatible with the request. These and other advantages may be achievable through the application of the techniques presented herein.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1:
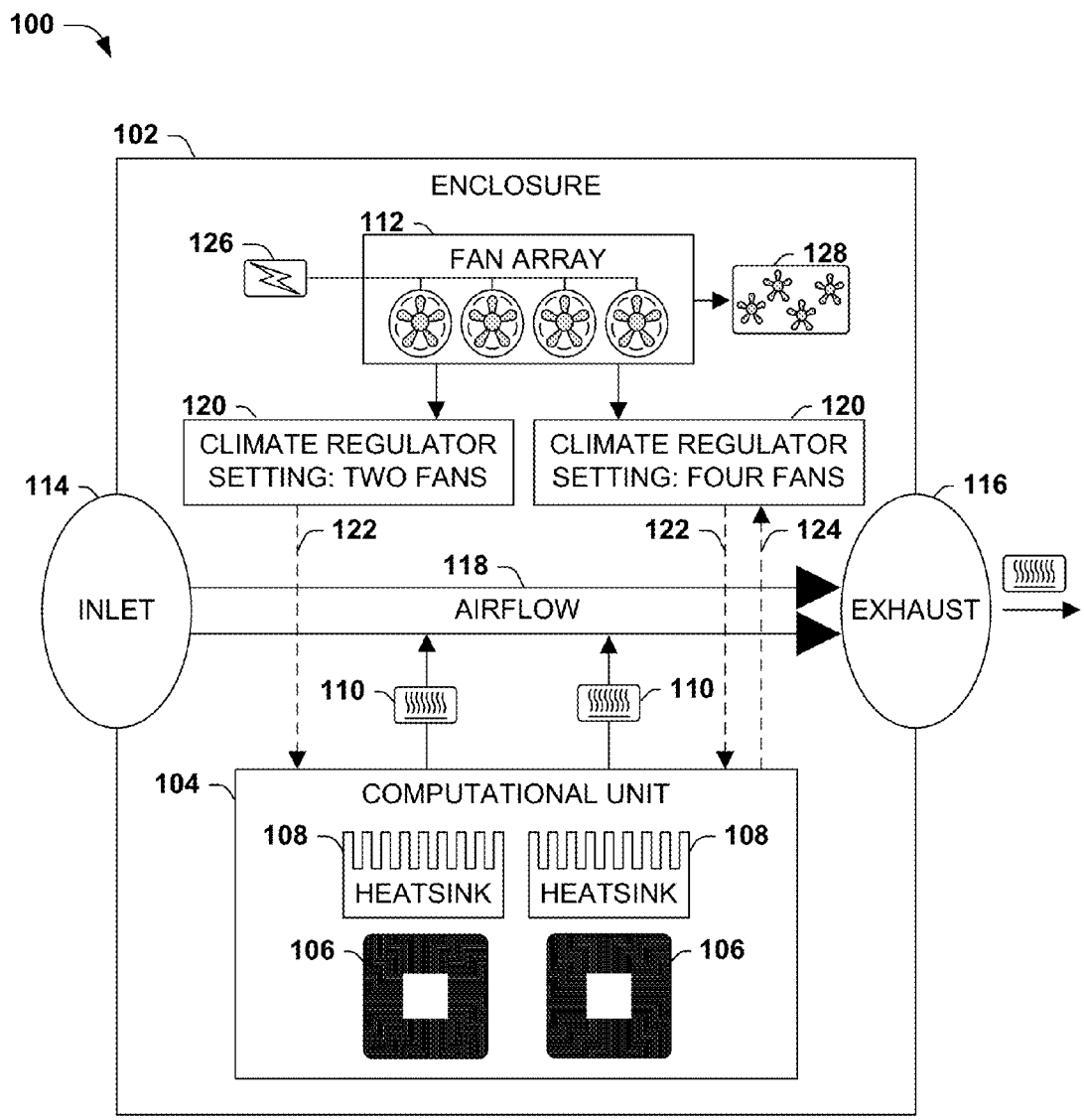
FIG. 1 is an illustration of an exemplary scenario featuring an enclosure comprising a fan array provided to manage air temperature.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, structures and devices are shown in block diagram form in order to facilitate describing the claimed subject matter.

A. Introduction

Within the field of computing, many scenarios involve an enclosure storing one or more devices, such as an enclosure storing a computer comprising a mainboard, one or more processors, volatile and nonvolatile storage, and communications components such as network adapters, or a server cabinet storing components comprising one or more servers. In these scenarios, the air within the enclosure may vary in particular climate properties, such as the temperature, humidity, air pressure, and the reduction of particulate matter (e.g., dust and smoke) of the air within the enclosure. The devices within the enclosure may be sensitive to such properties of the climate; e.g., electronic components may function reliably only within a range of operating temperatures, and excess humidity may disrupt electrical propagation of circuits. Additionally, the operation of the devices may alter such properties, e.g., by generating heat or creating particulate contaminants through friction between moving components, and may exacerbate undesirable climate conditions within the enclosure. The consistent and reliable operation of the devices within the enclosure may therefore depend on regulating various properties of the climate within the enclosure.

In view of these considerations, the enclosure may include one or more climate regulating components that are configured to regulate various properties of the climate within the enclosure. Such regulation may be achieved through "passive" climate regulator devices that present physical and/or chemical properties that provide regulatory capabilities, such as heatsinks comprising conductive metals in physical contact with a device that diffuse excess heat over a wide surface area to facilitate cooling, and screens that trap particulate matter to reduce contamination within the enclosure. Further climate regulation may be provided by "active" climate regulator devices that utilize electric power. For example, the temperature of the air within the enclosure may be regulated by fans, air conditioners, and heaters; humidity regulation may be regulated by humidifiers and dehumidifiers; air pressure may be regulated by compressors; and particulate matter may be regulated by electrostatic air filters.

"Active" climate regulators may often present various operating levels, such as fan speeds of fans; cooling magnitude provided by air conditioners; heat generated by heating units; and the strength of an electrostatic field configured to trap particles. Such operating levels may be controlled, e.g., by a physical switch positioned on the device that a user may manually toggle, or by software instructions generated by a user or device. While utilizing higher operating levels of climate regulators may provide greater climate regulation (e.g., more rapid and/or precise regulation of temperature and more powerful electrostatic removal of particulate matter), higher operating levels may entail undesirable side-effects (e.g., higher fan speeds may generate fan noise; stronger electrostatic fields may create interference with wired or wireless electric or magnetic signals; and higher operating levels may consume more power, thus increasing operating costs and draining batteries in mobile devices). In view of these considerations, it may be desirable to balance higher climate regulation with undesirable side-effects by adapting the operating levels of climate regulator devices in response to conditions within the enclosure, e.g., by configuring control modules to increase the operating levels of climate regulators when circumstances within the enclosure indicate additional climate regulation, and to reduce the operating levels of climate regulators when climate regulation may be acceptably conserved.

FIG. 1 presents an illustration of an exemplary scenario 100 featuring an enclosure 102 storing a computational unit 104 (e.g., a set of processors 106 comprising one or more servers). The climate within the enclosure 102 may fluctuate in various respects, including the air temperature within the enclosure 102, in part due to heat 110 generated by the operation of the processors 106. In order to regulate the air temperature, the enclosure 102 may include a set of heatsinks 108, comprising a block of material in physical contact with each processor 106 and exhibiting a high heat conductivity and a high surface area, such that heat 110 generated by the operation of the processors 106 is exposed to a larger volume of air and thus conveyed away from the processors 106. However, such "passive" cooling may be inadequate; e.g., as the temperature of static air within the enclosure 102 rises, the thermal differential between the surface of the processors 106 and the air may be diminished, reducing the effectiveness of the heatsinks 108. Therefore, the enclosure 102 also includes "active" climate regulation in the form of a fan array 112, comprising a set of four fans positioned in the enclosure 102 to create airflow 118 across the heatsinks 108. In particular, the fan array 110 may draw air from outside of the enclosure 102 into the enclosure 102 through an inlet 114, and/or may expel air through an exhaust 116, thus creating airflow 118 within the enclosure 102 that expels heat 110 and generates cooling 128 of the climate within the enclosure 102. Moreover, the fan array 112 may be configurable to utilize various climate regulator settings 120 to adapt to conditions within the enclosure 102. For example, applying power 126 to more or fewer fans in the fan array 112 may alter the magnitude of cooling 128.

In this exemplary scenario 100, the operation of the fan array 112 is specified by the computational unit 104 through the available climate regulator settings 120. For example, the fan array 112 may report 122 the available climate regulator settings 120 to the computational unit 104. If the enclosure 102 registers a high air temperature that may jeopardize the proper functioning of the processors 106, the computational unit 104 may select the climate regulator setting 120 for utilizing all four fans, and may send a request 124, such as a specially encoded electronic signal, to the fan array 112 in order to choose the "four fans" selected climate regulator setting 120. The fan array 112 may therefore deliver power 126 to all of the fans, creating a large amount of airflow 118 resulting in rapid cooling 128 of the air temperature within the enclosure 120. Alternatively, if the enclosure registers an acceptable air temperature within the enclosure 102, the computational unit 104 may send a request 124 to the fan array 112 to select the "two fans" climate regulator setting 120. The fan array 112 may fulfill this request by delivering power 126 only to one fan, thereby providing reduced airflow 118 and reduced cooling 128 within the enclosure 102. In this manner, the enclosure 102 may control the operation of the fan array 112 to provide variable levels of cooling 128 in response to conditions within the enclosure 102.

B. Presented Techniques

The techniques presented in the exemplary scenarios of FIG. 1 may achieve variable climate regulation within the enclosure 102 based on the particular capabilities of the fan array 112. However, in this exemplary scenario 100, the fan array 112 and computational unit 104 communicate according to the particular climate regulator settings 120 supported by the fan array 112; e.g., the fan array 112 is configured to report 122 the available climate regulator settings 120 to the computational unit 104, and the computational unit 104 sends a request 124 selecting one of the available climate regulator settings 120.

This architecture may impose some limitations on the architecture of the climate regulation infrastructure. As a first example, the computational unit 104 may only select the types of climate regulator settings 120 that it understands. For example, the computational unit 104 may be compatible with the climate regulator settings 120 of the first fan array 112 specified as "four fans" and "two fans," or may even report its selectable climate regulator settings 120 as "high" (specifying four fans) and "low" (specifying two fans), and the computational unit 104 may be capable of choosing among these climate regulator settings 120. However, a more sophisticated fan array 112 may specify its climate regulator settings 120 both in terms of the number of fans and the speed of the fans, and may enable the computational unit 104 to alter both the power and the topography of the airflow 118 (e.g., applying higher cooling targeting the processors 106, or applying cooling broadly to all of the components within the entire computational unit 104), but the computational unit 104 may not be configured to select among such properties. Similar problems may arise in view of standards (e.g., a climate regulator setting 120 may specify its settings in degrees Fahrenheit, while the computational unit 104 interprets them as degrees Celsius). As a second example, this architecture may simply be incompatible with different types of climate regulation that report different types of climate regulator settings 120. For example, a liquid-cooling climate regulator system may specify its climate regulator settings 120 in terms of liquid flow rates, and the computational unit 104 may be incapable of utilizing this information to choose a correct climate regulator setting 120. As a third example, the architecture may be confined to a particular type of climate regulation; e.g., the climate regulation infrastructure that is configured based on airflow and temperature may be incompatible with a climate regulator device providing humidity control or filtration of particulate matter. As a fourth example, if the climate regulator settings 120 for a particular climate regulator device change (e.g., the addition of new climate regulator settings 120 after the addition of more fans, or the removal of a climate regulator setting 120 involving a fan that has failed), the computational unit 104 may be incapable of adjusting to the new climate regulator settings 120. As a fifth example, it may be difficult to reconcile different requests communicated by different computational units 104 (e.g., a first computational unit 104 in the enclosure 102 requesting a two-fan climate regulator setting 102, and a second computational unit 104 in the same enclosure 102 requesting a four-fan climate regulator setting 102). As a sixth example, a computational unit 104 may have difficulty operating two or more climate regulator devices, particularly if such devices offer different sets of climate regulator settings 120 (e.g., a first fan array 112 providing "two fan" and "four fan" settings, and a second fan array 112 providing "high" and "low" settings).

It may be appreciated that these and other problems may be related to the communication between the computational unit 104 and the climate regulator devices based on the available climate regulator settings 120. That is, the computational unit 104 has to be aware of the climate regulator settings 120 supported by the climate regulator device(s); has to be capable of choosing among such climate regulator settings 120 based on some criteria; and has to communicate the request 124 to the fan 112 according to the climate regulator settings 120 (e.g., a specially encoded electronic signal identifying the "two fan" climate regulator setting 120). Additionally, the climate regulator device may have to be configured to communicate the climate regulator settings 120 to the computational unit 104 according to a particular communication standard, and to receive an electrical signal from the computational unit 104 encoding a request specifying a particular climate regulator setting 120. These constraints, associated with the architecture designed around communicating based on the particular climate regulator settings 120 of the climate regulator device, may therefore increase the complexity and reduce the flexibility of the climate regulation architecture.

Presented herein are alternative climate regulator architectures that decouple the requests of the computational unit 104 from the climate regulator settings 120 of the climate regulator devices. In such scenarios, the computational units 104 may operate without any information about the climate regulator settings 120 of the climate regulator device, or even the number, type, and capabilities of climate regulator devices within the enclosure 102. Rather, the computational unit 104 may specify a climate target that requests climate regulation through a device-independent set of options— e.g., an arbitrary climate regulation gradient, represented as a scale from 0 indicating a minimum climate regulation (e.g., no climate regulation) to 100 indicating a maximum climate regulation. A climate regulator controller may receive the device-independent climate target, map it to the particular climate regulator settings 120 of the particular climate regulator device(s), and operate the climate regulator devices at the selected climate regulator settings 120.

Figure 2:
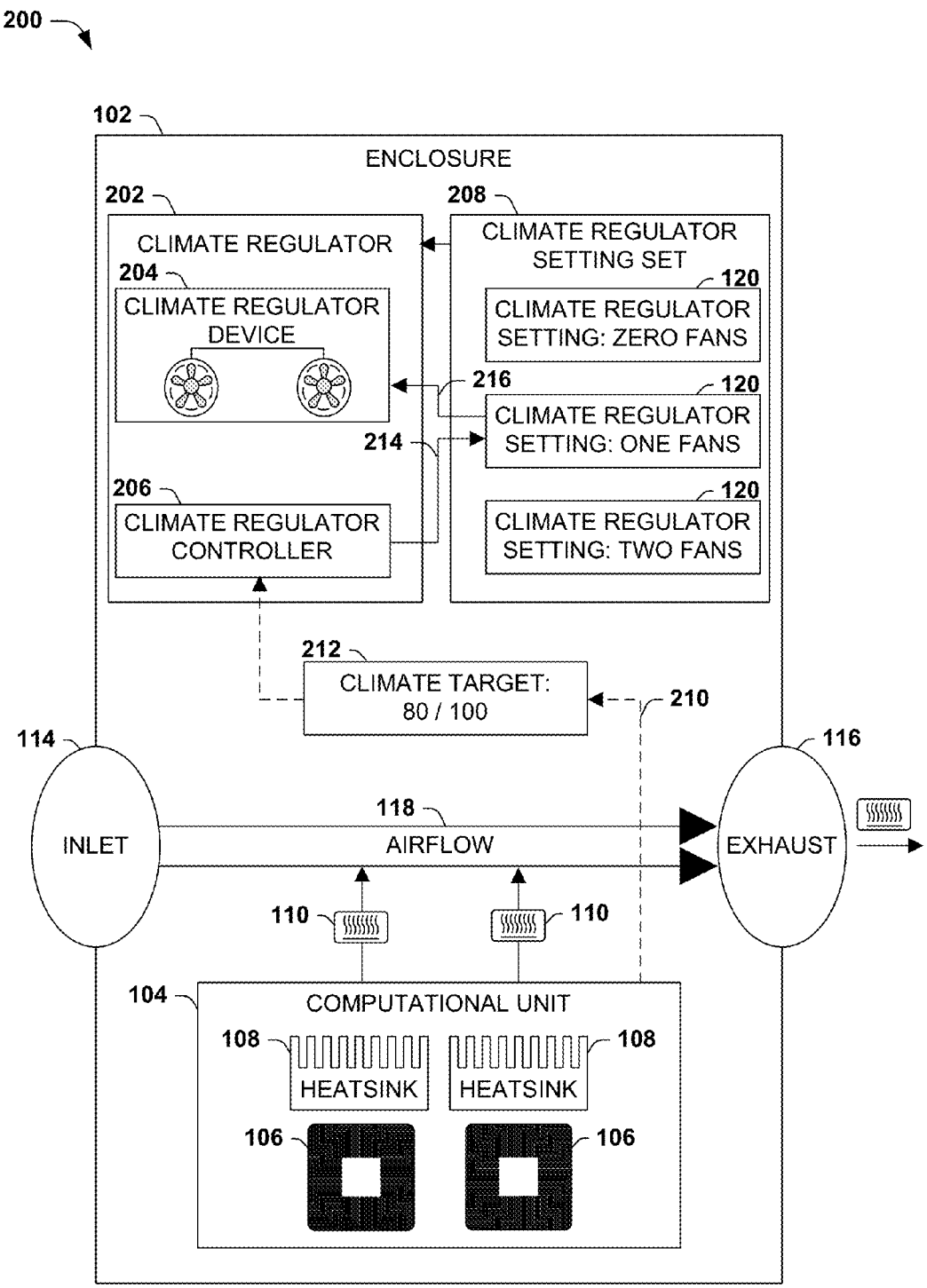
FIG. 2 is an illustration of an exemplary scenario featuring an enclosure comprising a fan array provided to manage air temperature within the enclosure according to the techniques presented herein.

FIG. 2 presents an illustration of an exemplary scenario 200 featuring an exemplary architecture implementing the device-independent climate regulation infrastructure provided herein. In this exemplary scenario 200, the enclosure 102 comprises a computational unit 104 and a climate regulator device 204 (e.g., a fan array) configured to generate an airflow 118 within the enclosure 102 in order to draw cool air into the enclosure 102 through an outlet 114 and to expel heat 110 through an exhaust 116, thus providing cooling to the computational unit 104 supplementing the heatsinks 108 of the processors 106. In this exemplary scenario 200, the climate regulator device 204 is coupled with a climate regulator controller 206 as a climate regulator 202 that communicates with the computational unit 104. Additionally, while the climate regulator device 204 is operable at a set of climate regulator settings 120 in a climate regulator setting set 208, this information may not be directly utilized by the computational unit 104. Rather, the computational unit 104 specifies the request 124 for climate regulation as a climate target 212 that is independent of the climate regulator settings 120 of the climate regulator device 204, e.g., an arbitrary value selected on the gradient from 0 to 100. The climate target 212 is received by the climate regulator controller 206, which maps 214 the device-independent climate target 212 to a climate regulator setting 120 of the climate regulator 202 (selected form the climate regulator setting set 208 for the climate regulator device 204), and then operates 216 the climate regulator device 204 at the selected climate regulator setting 120.

The climate regulation architecture illustrated in the exemplary scenario 200 of FIG. 2 may provide several advantages over device-specific architectures. As a first example, the climate regulator device 204 does not have to report 122 the climate regulator settings 120 to the computational unit 104, and the computational unit 104 does not have to issue a request 124 specially encoding a particular climate regulator setting 120 of the climate regulator device 204. Rather, any computational unit 104 may specify the climate target 212 (e.g., as an abstract value) that may be applied by any climate regulator device 204. As a second example, an arbitrary climate target 212, such as a "0 to 100" selection, may be applicable to a wide range of climate regulator devices 204, including those presenting new and/or unusual types or capabilities. As a third example, the climate regulator controller 206 may utilize a variety of logic for this mapping 214, optionally involving other properties (e.g., also involving a detected climate property within the enclosure 102 and/or the currently selected climate regulator setting 120 of the climate regulator device 204). The mapping 214 may also be performed according to a policy (e.g., applying the "0 to 100" request based on a maximum cooling policy or an energy-saving policy). Additionally, it may be easier to reconcile conflicts between requests 124 received from different computational units 104 (e.g., a climate target of "40" from a first server and of "80" from a second server), and/or to apply the requests 124 to a varied set of climate regulator devices 204. These and other advantages may be achievable through the device-independent climate regulator architecture provided herein.

C. Embodiments

Figure 3:
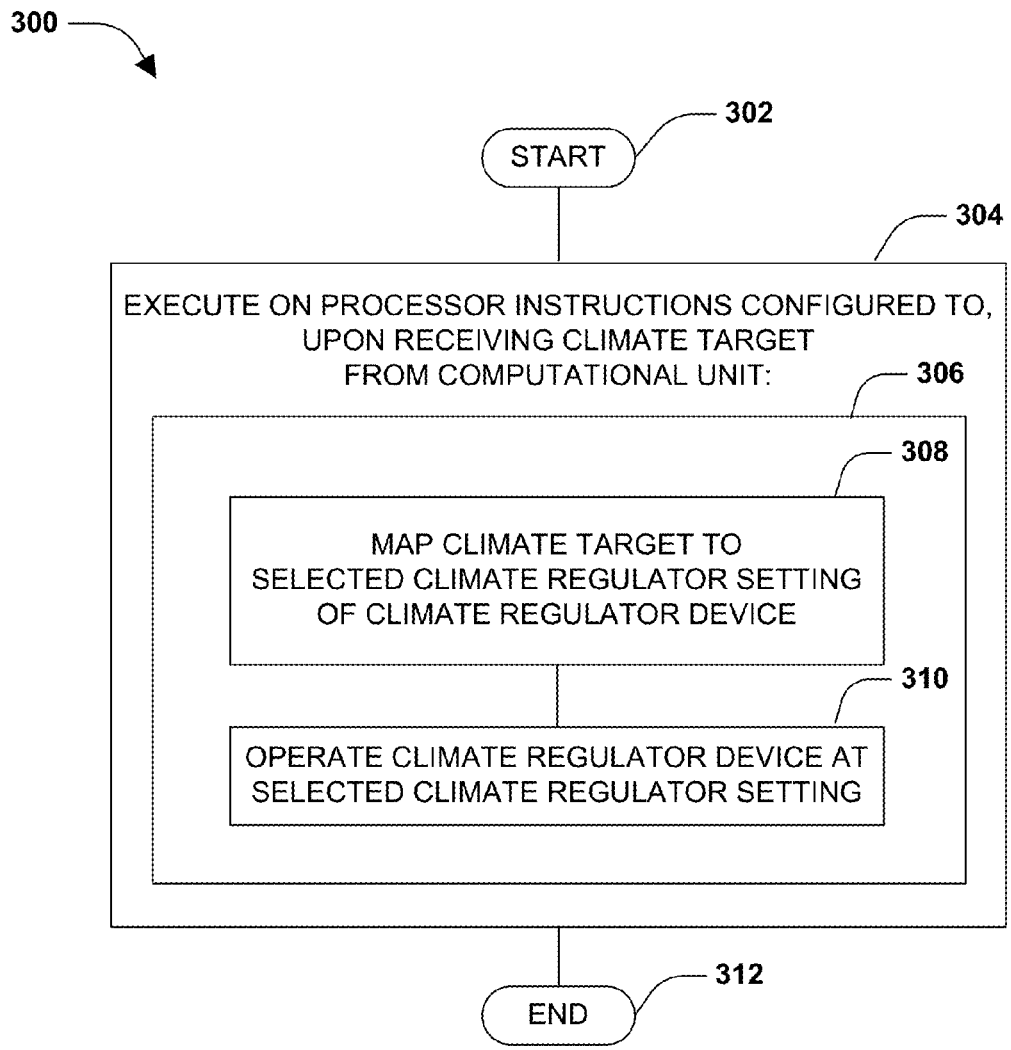
FIG. 3 is a flow diagram illustrating an exemplary method of controlling a climate regulator device in accordance with the techniques presented herein.

FIG. 3 presents an illustration of a first exemplary embodiment of the techniques presented herein, illustrated as an exemplary method 300 of controlling a climate regulator device 204 on behalf of a computational unit 104. The exemplary method 300 may be implemented, e.g., as a set of instructions stored in a memory device (e.g., a volatile memory circuit, a platter of a hard disk drive, a solid-state storage device, or a magnetic and/or optical disc) and executable by a processor. The exemplary method 300 begins at 302 and involves executing 304 the instructions on the processor. Specifically, the instructions are configured to, upon receiving 306 from the computational unit 206 a climate target 212 in a climate target set that is independent of the climate regulator settings 120 provided by the climate regulator device 204, map 308 the climate target 212 to a selected climate regulator setting 120 of the climate regulator device 204, and operate 310 the climate regulator device 204 at the selected climate regulator setting 120. Having achieved the operation of the climate regulator device 204 based on the climate target 212 specified by the computational unit 104, the exemplary method 300 achieves the control of the climate regulator device 204 according to the techniques presented herein, and so ends at 312.

Figure 4:
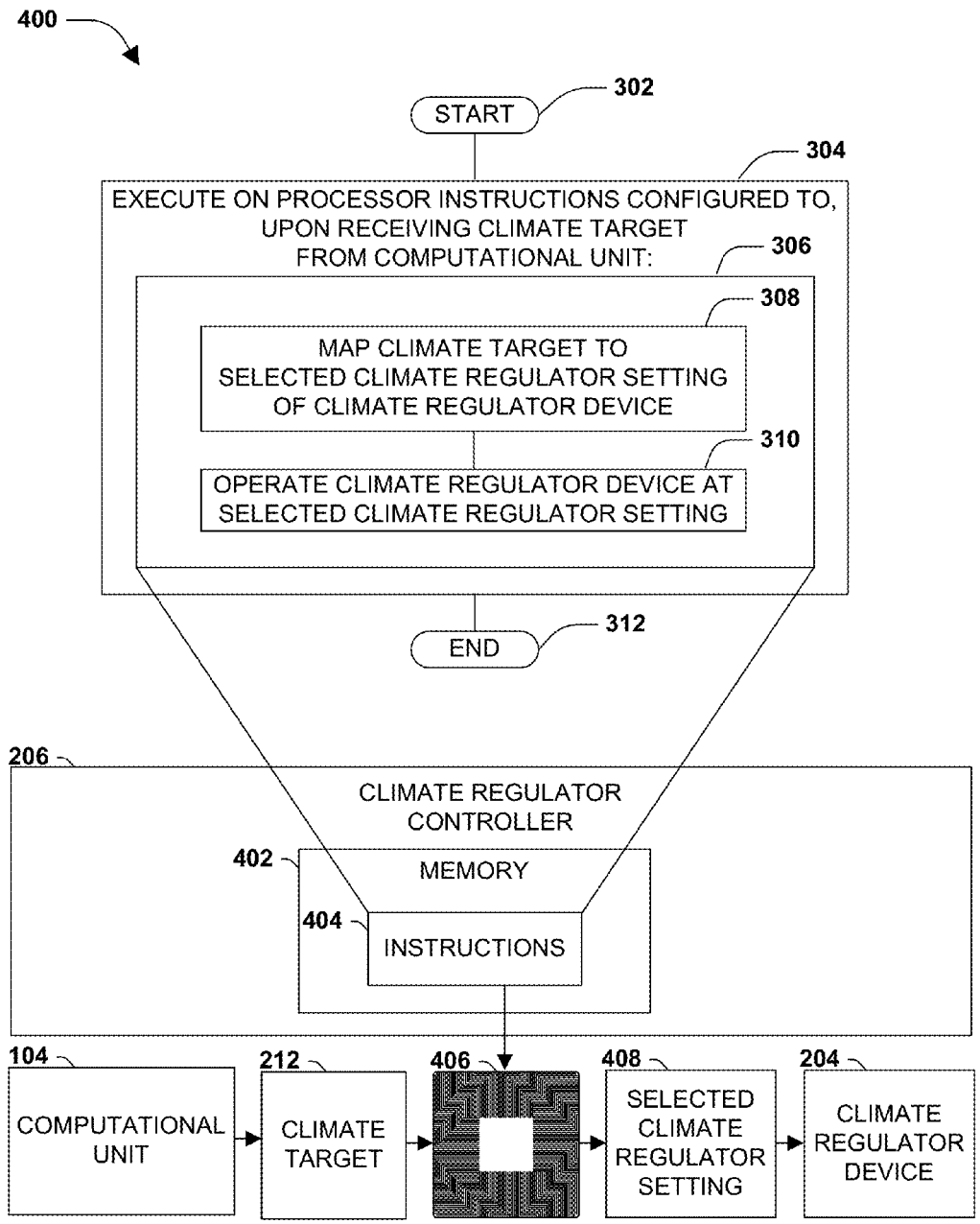
FIG. 4 is a component diagram illustrating an exemplary climate regulator controller configured to operate a climate regulator device in accordance with the techniques presented herein.

FIG. 4 presents an illustration of an exemplary scenario 300 featuring a second embodiment of the techniques presented herein. In this exemplary scenario 400, an enclosure 102 stores a computational unit 104 that specifies a climate target 212 to the climate regulator controller 206, which is configured to apply the techniques presented herein. As one such example, the climate regulator controller 206 may comprise a processor 406 and a memory 402 storing instructions 404 that, when executed on the processor 406, cause the climate regulator controller 206 to operate the climate regulator device 204 according to the techniques presented herein (e.g., according to the exemplary method 300 of FIG. 3).

Still another embodiment involves a computer-readable medium comprising processor-executable instructions configured to apply the techniques presented herein. Such computer-readable media may include, e.g., computer-readable storage media involving a tangible device, such as a memory semiconductor (e.g., a semiconductor utilizing static random access memory (SRAM), dynamic random access memory (DRAM), and/or synchronous dynamic random access memory (SDRAM) technologies), a platter of a hard disk drive, a flash memory device, or a magnetic or optical disc (such as a CD-R, DVD-R, or floppy disc), encoding a set of computer-readable instructions that, when executed by a processor of a device, cause the device to implement the techniques presented herein. Such computer-readable media may also include (as a class of technologies that are distinct from computer-readable storage media) various types of communications media, such as a signal that may be propagated through various physical phenomena (e.g., an electromagnetic signal, a sound wave signal, or an optical signal) and in various wired scenarios (e.g., via an Ethernet or fiber optic cable) and/or wireless scenarios (e.g., a wireless local area network (WLAN) such as WiFi, a personal area network (PAN) such as Bluetooth, or a cellular or radio network), and which encodes a set of computer-readable instructions that, when executed by a processor of a device, cause the device to implement the techniques presented herein.

Figure 5:
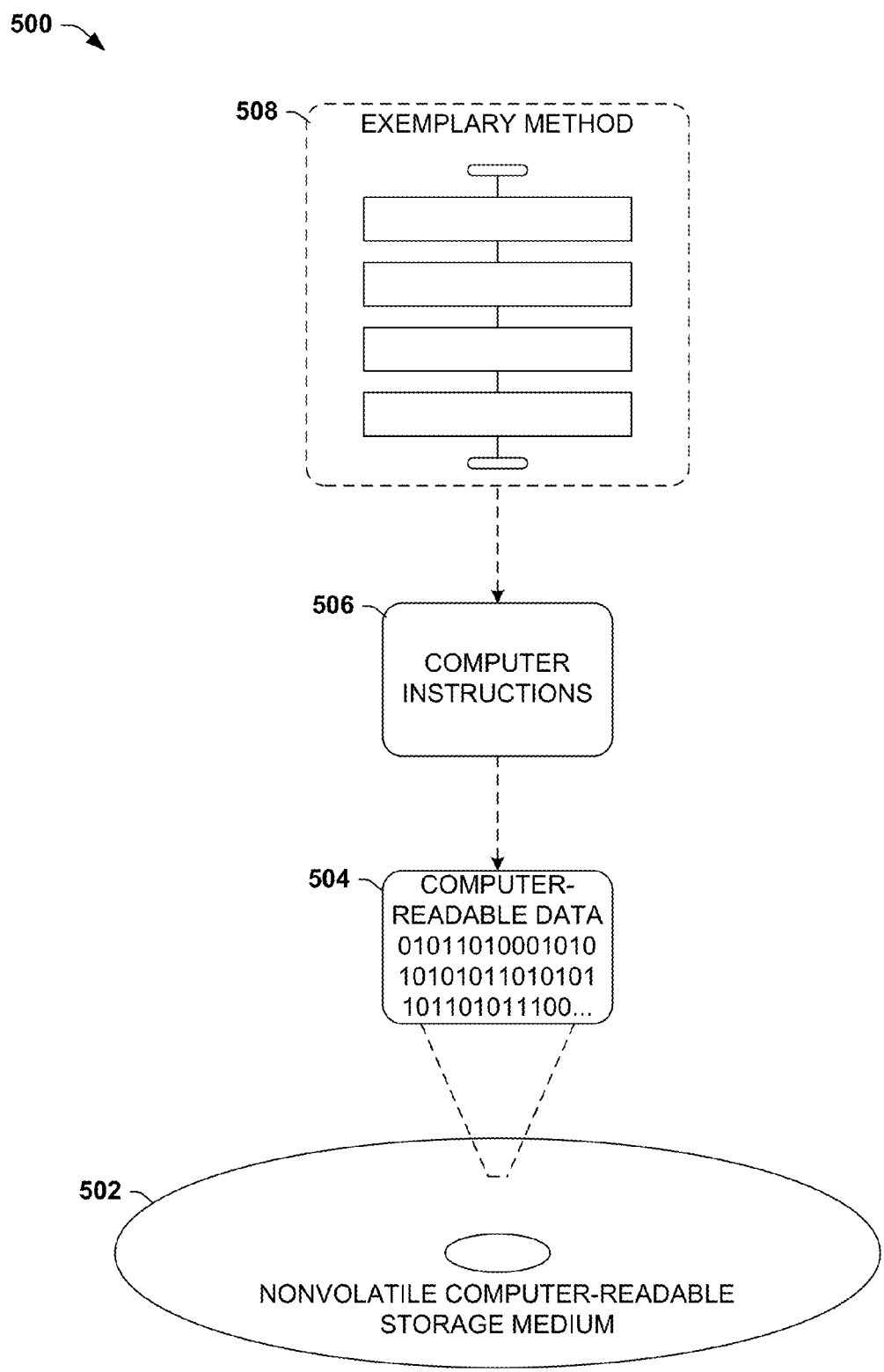
FIG. 5 is an illustration of an exemplary computer-readable storage medium comprising computer-executable instructions that cause a climate regulator controller to operate according to the techniques presented herein.

An exemplary computer-readable medium that may be devised in these ways is illustrated in FIG. 5, wherein the implementation 500 comprises a computer-readable medium 502 (e.g., a CD-R, DVD-R, or a platter of a hard disk drive), on which is encoded computer-readable data 504. This computer-readable data 504 in turn comprises a set of computer instructions 506 configured to operate according to the principles set forth herein. Some embodiments of this computer-readable medium may comprise a nonvolatile computer-readable storage medium (e.g., a hard disk drive, an optical disc, or a flash memory device) that is configured to store processor-executable instructions configured in this manner. Many such computer-readable media may be devised by those of ordinary skill in the art that are configured to operate in accordance with the techniques presented herein.

D. Variations

The techniques presented herein may be implemented with variations in many aspects, and some variations may present additional advantages and/or reduce disadvantages with respect to other variations of these and other architectures and implementations. Moreover, some variations may be implemented in combination, and some combinations may feature additional advantages and/or reduced disadvantages through synergistic cooperation.

D1. Scenarios

A first aspect that may vary among embodiments of these techniques relates to the scenarios wherein such techniques may be utilized.

As a first variation of this first aspect, the techniques presented herein may be used to regulate climate within many types of enclosures 102 storing many types of computational units 104. For example, the enclosures 102 may comprise a chassis and case of a workstation; the exterior of a notebook or palmtop computer; a cabinet of a server; or a rack storing a set of servers or workstation computers operating with various degrees of independence (e.g., a set of exposed mainboards with processing units comprising the blades of a multi-blade server, or a set of fully autonomous workstations that may communicate in a server/client or peer-to-peer manner or may be fully isolated from one another).

As a second variation of this first aspect, climate regulation may be provided on behalf of many types of computational units 104 stored within the enclosure 124, such as microprocessors; volatile memory circuits; nonvolatile storage devices such as hard disk drives and solid-state storage devices; input/output devices, such as display adapters, sound renderers, video and audio devices, and media encoding and decoding circuits; communications components, such as network adapters, switches, hubs, routers, modems, transceivers, and repeaters; and infrastructure components, such as mainboards and buses.

As a third variation of this first aspect, many types of climate regulator devices 204 may be included that feature many types of climate regulating properties. A a first example, the climate regulator devices 204 may control temperature within the enclosure 102, such as fans creating airflow 118; heaters creating heat within the enclosure 102; air conditioners that actively extract heat from the air within the enclosure 102; and liquid cooling systems that exchange air and liquid temperature, and then cool the liquid outside of the enclosure 102. As a second example, the climate regulator devices 204 may alter the conditions of the air within the enclosure 102, such as by removing ionized particles that may create undesired electrostatic charge within the enclosure 102. As a third example, the climate regulator devices 204 may regulate humidity, such as humidifiers and/or dehumidifiers. As a fourth example, the climate regulator devices 204 may regulate barometric pressure, such as air pumps that add or remove air from within an airtight enclosure 102. As a fifth example, the climate regulator devices 204 may alter air composition, such as by injecting oxygen, removing unwanted gases, or filtering out particulate solids. These and other climate regulation devices 204 may be controlled through an embodiment of the techniques presented herein.

D2. Mapping Climate Target to Climate Regulator Setting

A second aspect that may vary among embodiments of these techniques relates to the manner of configuring the climate regulator controller 206 to map 308 a climate target 212 that is specified independent of the type, properties, or climate regulator settings 408 of any particular climate regulator device 204, to a selected climate regulator setting 408 of a particular climate regulator device 204.

As a first variation of this second aspect, the climate target 212 may be specified as any member of a climate target set, such as any integer value within an arbitrarily gradient from 0 to 100, where 0 specifies a minimum climate regulation (e.g., no climate regulation) and 100 specifies a maximum climate regulation. The values in between may represent, e.g., a linear, logarithmic, or exponential scale between these extremes. Alternatively, the climate targets 212 may represent a more discrete or finite set of values, such as "above average," "average," "below average," and "off." Additionally, the climate targets 212 may have various (though still device-independent) semantics. For example, As a climate target 212 of "0" may indicate a request either to halt climate regulation (e.g., a request to stop cooling the enclosure 102 if the air temperature is already too cool), or may indicate that the computational unit 104 is performing acceptably, and that any climate regulator setting 120 that maintains the current conditions may be acceptable.

As a second variation of this second aspect, the climate regulator controller 206 identifies more than one climate regulator setting 408 that may map 308 to the climate target 212. As a first such example, a climate target 212 of "0," indicating that the current conditions are acceptable, may be compatible with either halting climate regulation, or with maintaining a low level of climate regulation (e.g., operating a fan at the lowest climate regulator setting 120). As a second such example, the number of climate regulator settings 120 supported by a climate regulator device 204 may exceed the number of climate targets 212 selectable within the climate target set. In such scenarios, the climate regulator controller 206 may apply some additional logic to choose among two or more climate regulator settings 120 that are compatible with the climate target 212. For example, where at least two of the climate regulator settings 120 comprising a compatible climate regulator setting for the climate target 212, the climate regulator controller 206 may identify the compatible climate regulator settings for the climate target 212, and map 308 the climate target 212 to a selected compatible climate regulator setting.

As a third variation of this second aspect, the climate regulator controller 206 may adjust the mapping 308, and/or re-map the climate target 212 to a new selected climate regulator setting 408, if the set of climate regulator devices 204 changes. As a first such example, a new climate regulator device 204 may be newly added to and/or removed from the enclosure 102. As a second such example, a current climate regulator device 204 may be selectively placed online and/or taken offline (e.g., certain high-powered climate regulator devices, such as air conditioners, may only be usable and included in the set of climate regulator devices 204 if the temperature exceeds a critical threshold, or only during a certain time of day, such as the hottest period of a day). As a third such example, a climate regulator device 204 may be detected to have failed or to be operating inefficiently or unacceptably (e.g., generating an unacceptable amount of noise). In such scenarios, the climate regulator controller 206 may re-map the climate target 212 to one or more different selected climate regulator settings 408, and the operation of the climate regulator devices 204 may be accordingly adjusted.

As a fourth variation of this second aspect, the climate regulator controller 206 may apply various considerations while mapping 308 the climate target 212 to the selected climate regulator setting 408. As one such example, the climate regulator 202 may further comprise at least two climate target mapping policies, each indicating a different logic for mapping the climate targets 212 to the climate regulator settings 120 (e.g., a "maximum cooling" policy that aggressively cools the enclosure 102, and an "energy saving" policy that conservatively cools the enclosure 102). The climate regulator controller 206 may identify a selected climate target mapping policy among the climate target mapping policies, and may map 308 the climate target 212 to a selected climate regulator setting 120 of the climate regulator device 204 according to the selected climate target mapping policy. The climate target policies may be provided or specified, e.g., by the climate regulator device 204, by a computational unit 104, and/or by a user of the device, and/or may be automatically evolved or attuned to the conditions of the enclosure 102. Additionally, the selection of a particular climate target policy, among the available policies, may be specified by the computational unit 104 and/or by the user, or may be automatically selected by the climate regulator controller 206 or another regulatory component of the enclosure 102 (e.g., an energy monitoring component of the enclosure 102 may select a "maximum cooling" climate target mapping policy when available energy is plentiful, and an "energy saving" climate target mapping policy when available energy is limited).

Figure 6:
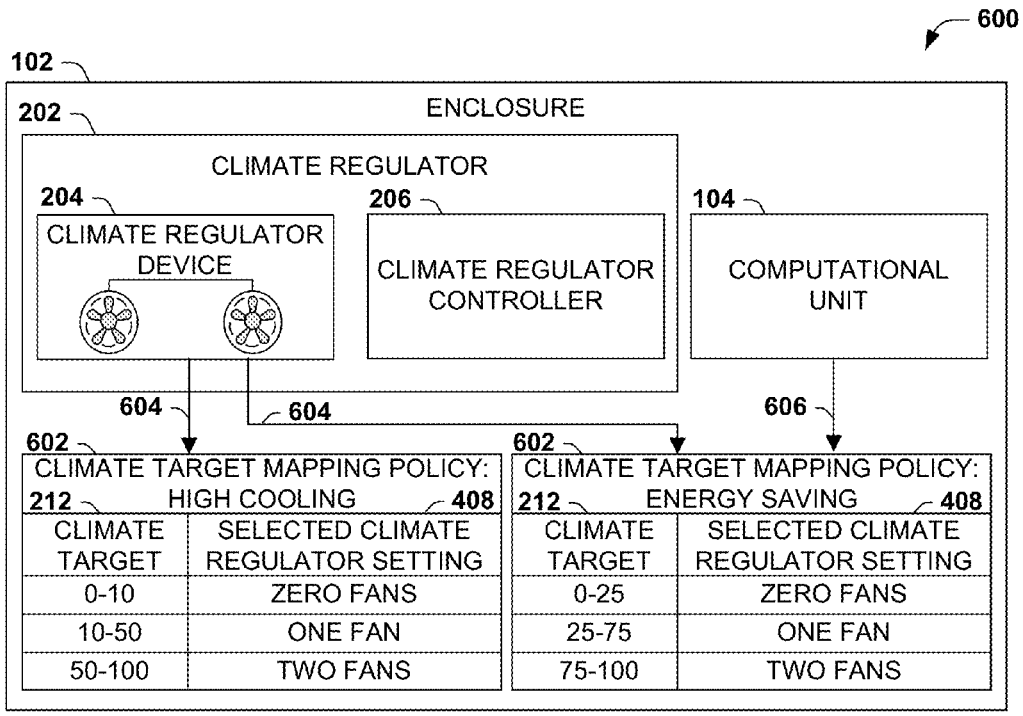
FIG. 6 is an illustration of an exemplary scenario featuring a selection among a set of climate target mapping policies.

FIG. 6 presents an illustration of an exemplary scenario 600 involving the use and selection of a plurality of climate target mapping policies 602. In this exemplary scenario 600, the enclosure 102 comprises a set of climate target mapping policies 602, each specifying a different map between a sub-range of climate targets 212 and a selected climate regulator setting 408 based on different considerations (high cooling vs. energy conservation). The climate target mapping policies 602 may be provided 604, e.g., by the climate regulator device 204, and the climate regulator controller 206 may be capable of utilizing either of the climate target mapping policies 602 to map 308 respective climate targets 212 to a selected climate regulator setting 408. Therefore, when the computational unit 206 selects 606 the energy-saving climate target mapping policy 602, the climate regulator controller 206 may store the selected climate target mapping policy 602, and may subsequently use the stored selection to perform the mapping 308 of climate targets 212 specified by the computational unit 206. In this manner, the climate regulator controller 206 may utilize the climate target mapping policies 602 to operate the climate regulator device 204 on behalf of the computational unit 206.

As a third variation of this second aspect, in some scenarios, the enclosure 102 may comprise two or more computational sub-units (e.g., a server cabinet storing two or more servers), each of which may specify a climate target 212. Moreover, the climate targets 212 may differ (e.g., a first computational sub-unit specifying a first climate target 212 of "20," and a second computational sub-unit concurrently specifying a second climate target 212 of "80" that is different from the first climate target 212), creating a conflict to be resolved by the climate regulator controller 206. The climate regulator controller 206 may therefore select a consensus climate target on behalf of the computational sub-units for mapping 308 to the selected climate regulator setting 408, such as selecting a maximum climate target of the first climate target 212 and the second climate target 212, or selecting a median average climate target (e.g., "50") of the first climate target 212 and the second climate target 212. Additionally, the conflict resolution may be specified by a climate target mapping policy 602 (e.g., a "high cooling" policy may indicate choosing the maximum climate target, and an "energy saving" policy may indicate choosing the median). As another example, the conflict resolution may involve identifying the significance of the requests (e.g., a first climate target 212 specified by a higher-priority component and a second climate target 212 specified by a lower-priority component), and may choose the consensus climate target accordingly.

As a fourth variation of this second aspect, the climate regulator controller 206 may receive the climate targets 212 from the computational units 104 in various ways. As a first example, the climate regulator controller 206 may provide a memory buffer (e.g., an SRAM, DRAM, or NVRAM memory region) where the computational units 104 may write a selected climate target 212, and may update the selected climate target 212 upon request. This example may present an advantage, e.g., of persisting a recent request from the computational unit 104 even if the computational unit 104 fails and is no longer able to specify the climate target 212. As a second example, the climate regulator controller 206 may query the computational unit 104 for a climate target 212 (e.g., once, periodically at a query frequency, or upon detecting a particular event, such as a change in climate conditions within the enclosure 102). This example may enable a more rapid detection by the climate regulator controller 206 of a failure of the computational unit 104; e.g., a computational unit 104 may be on the verge of failing due to high temperature, and the climate regulator controller 206 may automatically select a maximum climate target 202 in order to cool the computational unit 104 rapidly and potentially avoid a more significant failure.

As a fifth variation of this second aspect, the climate regulator controller 206 may be utilized to control a set of two or more climate regulator device 204, e.g., a set of two or more fan arrays within the enclosure 102. In some such scenarios, each climate regulator device 204 may be operable through a different climate regulator setting 102, and optionally may provide different climate regulator setting sets 208, or even different types of climate regulation (e.g., a fan array providing basic cooling and an air conditioner that provides more aggressive cooling). Moreover, a particular climate target 212 may be compatible with two or more sets of climate regulator settings 120 provided to the climate regulator device 204. For example, two identical fan arrays 112 may each provide a two-fan setting and a four-fan setting, and a climate target 212 may be mapped 214 to the activation of six fans, which may be achievable either by choosing the two-fan setting of the first fan array 112 and the four-fan setting of the second fan array 112, or vice versa. These and other techniques may be utilized for configuring the climate regulator controller 206 to map 214 at least one climate target 212 to a climate regulator setting 102 of at least one climate regulator device 204 in accordance with the techniques presented herein.

D3. Adjusting Climate Regulator Settings

A third aspect that may vary among embodiments of these techniques involves adjusting the mapping 214 of a climate target 212 to a selected climate regulator setting 120 in view of various other factors and/or events.

As a first example of this third aspect, a climate regulator controller 206 may use other sources of information to adjust the mapping 214 of a climate target 212 to the selection of climate regulator setting 120. As a first example, the climate regulator 202 may further comprise a climate detector that is configured to detect a climate property of a climate of the computational unit 104 (e.g., the current temperature of a processor 106) and/or a property of the climate within the enclosure 102 (e.g., the air temperature), and the climate regulator controller 206 may map 308 the climate target 212 and the climate property to the selected climate regulator setting 408 of the climate regulator device 204. As a second example, the climate regulator controller 206 may map 308 the climate target 202 to a selected climate regulator setting 408 of the climate regulator device 204 in view of the currently selected climate regulator setting 408 of the climate regulator device 204. For example, if the computational unit 104 selects a comparatively high climate target 212 of "80," but the climate regulator device 204 is currently unpowered, the climate regulator controller 206 may first select a low climate regulator setting 120, and may later select a higher climate regulator setting 120 if the computational unit 104 continues selecting a comparatively high climate target 212 of "80."

Figure 7:
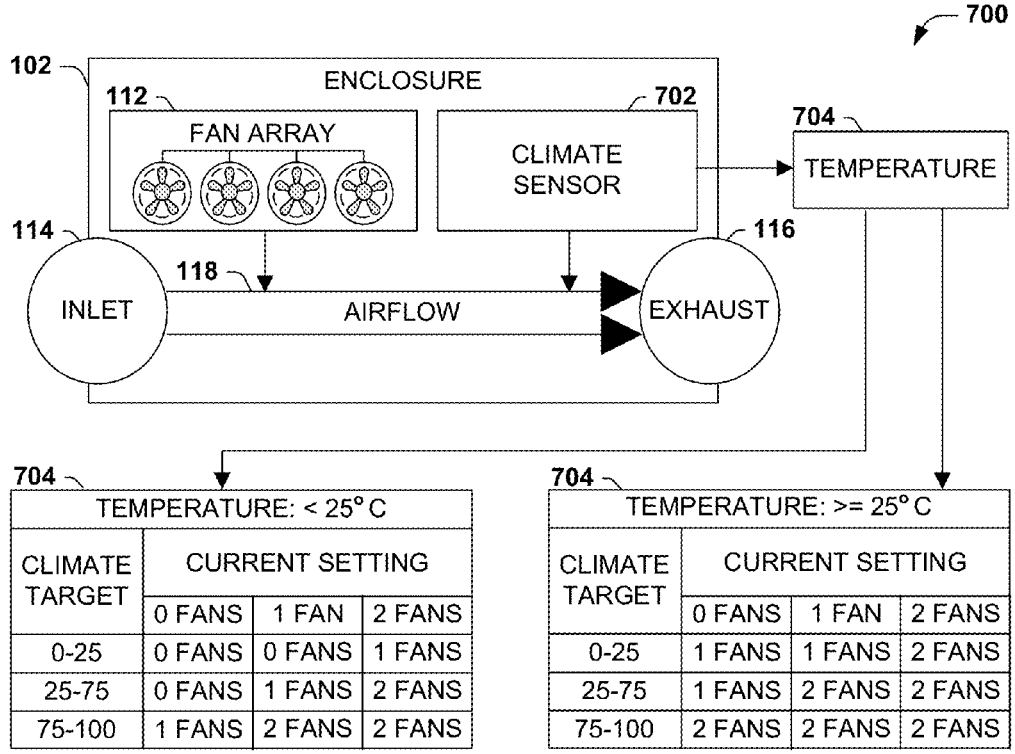
FIG. 7 is an illustration of an exemplary scenario featuring an exemplary climate target mapping policy featuring feedback mechanisms.

FIG. 7 presents an illustration of an exemplary scenario 700 featuring a selection of a selected climate regulator setting 408 in view of a climate target 212 as well as an air temperature 704 of the enclosure 102 and a currently selected climate regulator setting 408. In this exemplary scenario 700, the enclosure 102 features a fan array 112 generating an airflow 118 between an inlet 114 and an exhaust 116, and also a climate sensor 702 configured to measure an air temperature 704 of the airflow 118 (e.g., the air temperature 704 near the exhaust 106, which may indicate the effectiveness of the cooling achieved by the airflow 118). The mapping 308 may be adjusted not only on the climate target 212, but on the air temperature 704 and the currently selected climate regulator setting 408; e.g., if a climate target 212 of "50" is selected and the climate regulator device 204 is currently utilizing one fan out of two, the climate regulator controller 206 may continue using the one-fan climate regulator setting 120 if the climate sensor 702 detects that the current air temperature 704 at the exhaust 116 is acceptable, but may raise the selected climate regulator setting 408 to two fans if the air temperature 704 is unacceptably high. In this manner, the climate regulator controller 206 may utilize other properties in addition to the climate target 212 while mapping 308 and selecting a selected climate regulator setting 408 for the climate regulator device 204.

As a second variation of this third aspect, the climate regulator 202 may be adapted to detect and compensate for a failure of the climate regulator controller 206 as a failsafe mechanism. For example, the climate regulator device 204 may include a default climate regulator setting, to be used if selections from the climate regulator controller 206 are not provided. Upon detecting a failure of the climate regulator controller 206 (e.g., failing to receive a response from the climate regulator controller 206 while periodically requesting responses, such as a "heartbeat" detection model), the climate regulator device 204 may automatically select the default climate regulator setting. In this manner, the climate regulator 202 may provide climate regulation notwithstanding the failure of the climate regulator controller 206. These and other adjustments of the climate target 212 may be utilized by embodiments of the techniques presented herein.

E. Computing Environment

Figure 8:
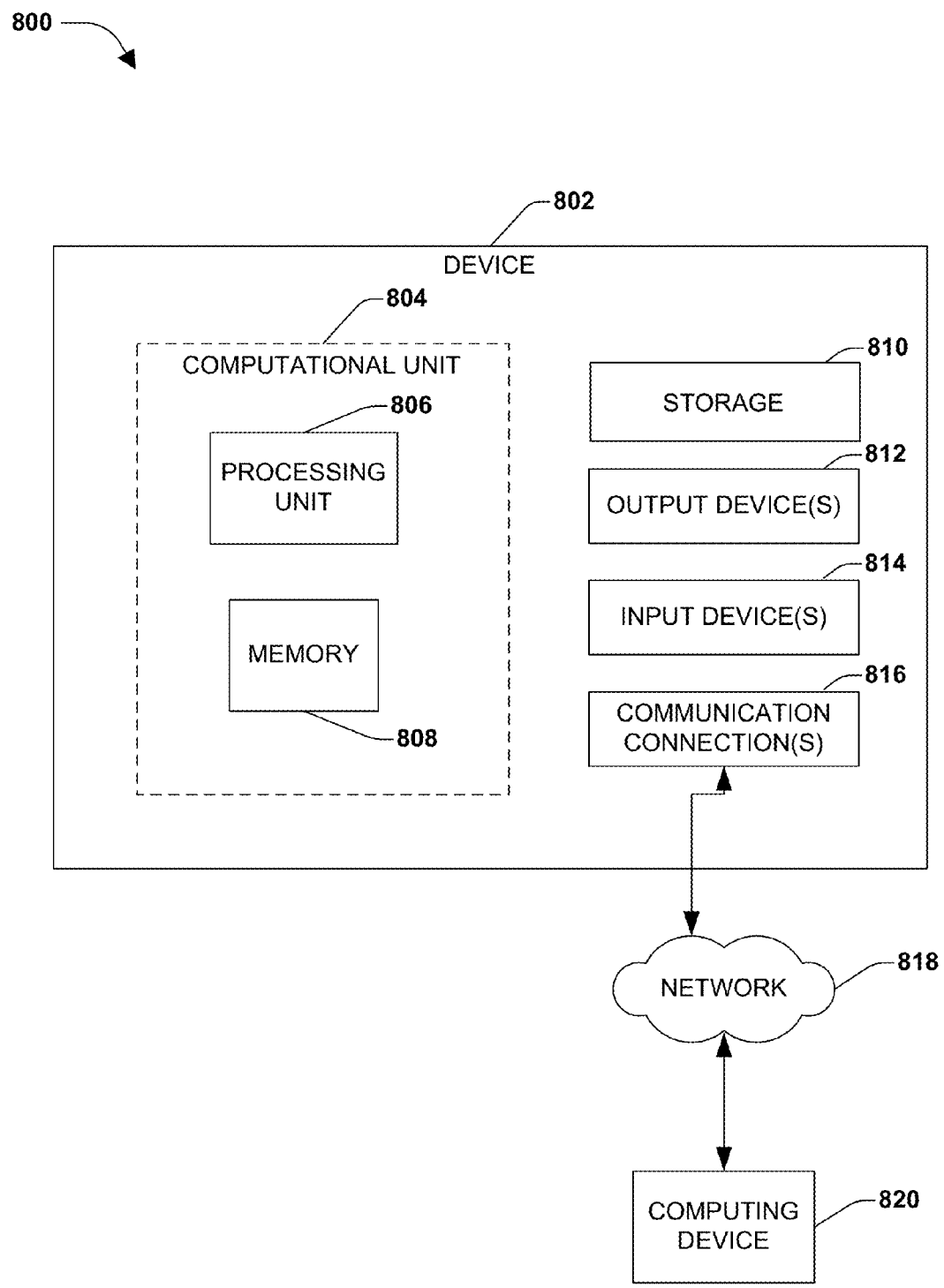
FIG. 8 is an illustration of an exemplary computing environment wherein one or more of the provisions set forth herein may be implemented.

FIG. 8 presents an illustration of an exemplary computing environment within a computing device 802 wherein the techniques presented herein may be implemented. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, and distributed computing environments that include any of the above systems or devices.

FIG. 8 illustrates an example of a system 800 comprising a computing device 802 configured to implement one or more embodiments provided herein. In one configuration, the computing device 802 includes at least one processor 806 and at least one memory component 808. Depending on the exact configuration and type of computing device, the memory component 808 may be volatile (such as RAM, for example), non-volatile (such as ROM, flash memory, etc., for example) or an intermediate or hybrid type of memory component. This configuration is illustrated in FIG. 8 by dashed line 804.

In some embodiments, device 802 may include additional features and/or functionality. For example, device 802 may include one or more additional storage components 810, including, but not limited to, a hard disk drive, a solid-state storage device, and/or other removable or non-removable magnetic or optical media. In one embodiment, computer-readable and processor-executable instructions implementing one or more embodiments provided herein are stored in the storage component 810. The storage component 810 may also store other data objects, such as components of an operating system, executable binaries comprising one or more applications, programming libraries (e.g., application programming interfaces (APIs), media objects, and documentation. The computer-readable instructions may be loaded in the memory component 808 for execution by the processor 806.

The computing device 802 may also include one or more communication components 816 that allows the computing device 802 to communicate with other devices. The one or more communication components 816 may comprise (e.g.) a modem, a Network Interface Card (NIC), a radiofrequency transmitter/receiver, an infrared port, and a universal serial bus (USB) USB connection. Such communication components 816 may comprise a wired connection (connecting to a network through a physical cord, cable, or wire) or a wireless connection (communicating wirelessly with a networking device, such as through visible light, infrared, or one or more radiofrequencies.

The computing device 802 may include one or more input components 814, such as keyboard, mouse, pen, voice input device, touch input device, infrared cameras, or video input devices, and/or one or more output components 812, such as one or more displays, speakers, and printers. The input components 814 and/or output components 812 may be connected to the computing device 802 via a wired connection, a wireless connection, or any combination thereof. In one embodiment, an input component 814 or an output component 812 from another computing device may be used as input components 814 and/or output components 812 for the computing device 802.

The components of the computing device 802 may be connected by various interconnects, such as a bus. Such interconnects may include a Peripheral Component Interconnect (PCI), such as PCI Express, a Universal Serial Bus (USB), firewire (IEEE 794), an optical bus structure, and the like. In another embodiment, components of the computing device 802 may be interconnected by a network. For example, the memory component 808 may be comprised of multiple physical memory units located in different physical locations interconnected by a network.

Those skilled in the art will realize that storage devices utilized to store computer readable instructions may be distributed across a network. For example, a computing device 820 accessible via a network 818 may store computer readable instructions to implement one or more embodiments provided herein. The computing device 802 may access the computing device 820 and download a part or all of the computer readable instructions for execution. Alternatively, the computing device 802 may download pieces of the computer readable instructions, as needed, or some instructions may be executed at the computing device 802 and some at computing device 820.

F. Usage of Terms

As used in this application, the terms "component," "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers.

Furthermore, the claimed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Various operations of embodiments are provided herein. In one embodiment, one or more of the operations described may constitute computer readable instructions stored on one or more computer readable media, which if executed by a computing device, will cause the computing device to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

Moreover, the word "exemplary" is used herein to mean serving as an example, instance, or illustration. Any aspect or design described herein as "exemplary" is not necessarily to be construed as advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of controlling, using a processor of a computing device, a climate regulator device on behalf of a computational unit, the climate regulator device having at least two climate regulator settings, the method comprising:
    executing, on the processor, instructions that cause the computing device to:
        store a climate regulator map that identifies, for respective climate targets and among the at least two climate regulator settings of the climate regulator device, a selected climate regulator setting with which to operate the climate regulator device to provide a magnitude of climate regulation that satisfies the climate target; and
        responsive to receiving from the computational unit a climate target in a climate target set that are independent from the climate regulator settings provided by the climate regulator device:
            using the climate regulator map, identifying, for the climate target and among the at least two climate regulator settings of the climate regulator device, a selected climate regulator setting of the climate regulator device with which to operate the climate regulator device to provide a magnitude of climate regulation that satisfies the climate target; and
            causing the climate regulator device to operate at the selected climate regulator setting.

2. The method of claim 1, wherein the climate target set further comprises an arbitrary climate regulation gradient between a minimum climate regulator setting and a maximum climate regulator setting.

3. The method of claim 1, wherein:
at least two of the climate regulator settings further comprise a compatible climate regulator setting for the climate target; and
mapping the climate target further comprises:
among the climate regulator settings, identifying at least two compatible climate regulator settings for the climate target; and
among the compatible climate regulator settings, mapping the climate target to a selected compatible climate regulator setting.

4. The method of claim 1, wherein:
the climate regulator device further comprises at least two climate target mapping policies including a selected climate target mapping policy; and
mapping the climate target further comprises: mapping the climate target to a selected climate regulator setting of the climate regulator device according to the selected climate target mapping policy.

5. The method of claim 4, wherein at least one climate target mapping policy is provided by the climate regulator device.

6. The method of claim 4, wherein executing the instructions further causes the computing device to, responsive to receiving from a user a selection among the climate target mapping policies of a particular climate target mapping policy, select the particular climate target mapping policy.

7. The method of claim 4, wherein executing the instructions further causes the computing device to, responsive to receiving from the computational unit a selection among the climate target mapping policies of a particular climate target mapping policy, select the particular climate target mapping policy.

8. The method of claim 1, wherein mapping the climate target further comprises: mapping the climate target and a current climate regulator setting of the climate regulator device to a selected climate regulator setting of the climate regulator device.

9. A climate regulator for a computational unit, comprising:
a climate regulator device having at least two climate regulator settings;
a climate regulator map that identifies, for respective climate targets and among the at least two climate regulator settings of the climate regulator device, a selected climate regulator setting to provide a magnitude of climate regulation that satisfies the climate target; and
a climate regulator controller that, responsive to receiving from the computational unit a climate target in a climate target set that is independent from the climate regulator settings provided by the climate regulator device, is configured to:
using the climate regulator map, identify, for the climate target and among the at least two climate regulator settings of the climate regulator device, a selected climate regulator setting of the climate regulator device with which to operate the climate regulator device to provide a magnitude of climate regulation that satisfies the climate target; and
cause the climate regulator device to operate at the selected climate regulator setting.

10. The climate regulator of claim 9, wherein:
the climate regulator further comprises a climate detector that detects a climate property of a climate of the computational unit; and
mapping the climate target further comprises mapping the climate target and the climate property to a selected climate regulator setting of the climate regulator device.

11. The climate regulator of claim 9, wherein:
the climate regulator further comprises a climate regulator device set comprising at least two climate regulator devices respectively having a climate regulator setting;
mapping the climate target further comprises, for respective selected climate regulator devices, mapping the climate target to a selected climate regulator setting for the selected climate regulator device; and
operating the climate regulator device further comprises, for respective selected climate regulator devices, operating the selected climate regulator device at the selected climate regulator setting.

12. The climate regulator of claim 11, wherein the climate regulator controller, responsive to detecting a change in the climate regulator device set, for respective selected climate regulator devices, remaps the climate target to a selected climate regulator setting for the selected climate regulator device.

13. The climate regulator of claim 9, wherein receiving the climate target from the computational unit further comprises querying the computational unit for the climate target.

14. The climate regulator of claim 13, wherein querying the computational unit further comprises periodically querying the computational unit for the climate target at a query frequency.

15. The climate regulator of claim 9, wherein:
the computational unit comprising at least two computational sub-units respectively providing a climate target; and
the climate regulator controller, responsive to receiving from a first computational sub-unit a first climate target, and from a second computational sub-unit a second climate target that is different from the first climate target:
in view of the first climate target and the second climate target, selects a consensus climate target; and
maps the consensus climate target to the selected climate regulator setting of the climate regulator device.

16. The climate regulator of claim 15, wherein selecting the consensus climate target further comprises selecting a maximum climate target of the first climate target and the second climate target.

17. The climate regulator of claim 15, wherein selecting the consensus climate target further comprises selecting a median average climate target of the first climate target and the second climate target.

18. The climate regulator of claim 9, wherein:
respective climate regulator devices further comprise a default climate regulator setting; and
the climate regulator further comprises a climate regulator device selector that, responsive to detecting a failure of the climate regulator controller, for respective climate regulator devices, selects the default climate regulator setting.

19. The climate regulator of claim 18, wherein:
the climate regulator controller periodically requests a response from the climate regulator controller; and detecting the failure of the climate regulator controller comprising: failing to receive the response from the climate regulator controller.

20. An enclosure for a computational load, the enclosure comprising:
- at least one computational unit providing the computational load;
- a climate sensor that senses a climate property within the enclosure;
- a climate regulator device that regulates the climate property within the enclosure, and having at least two climate regulator settings;
- a climate regulator map that identifies, for respective climate targets and among the at least two climate regulator settings of the climate regulator device, a selected climate regulator setting with which to operate the climate regulator device to provide a magnitude of climate regulation that satisfies the climate target; and
- a climate regulator controller that, responsive to receiving from the computational unit a climate target in a climate target set that is independent from the climate regulator settings provided by the climate regulator device, is configured to:
  - using the climate regulator map, identify, for the climate target and among the at least two climate regulator settings of the climate regulator device, a selected climate regulator setting of the climate regulator device with which to operate the climate regulator device to provide a magnitude of climate regulation that satisfies the climate regulator target; and
  - cause the climate regulator device to operate at the selected climate regulator setting.

* * * * *